(12) United States Patent
Ni

(10) Patent No.: US 7,557,739 B1
(45) Date of Patent: Jul. 7, 2009

(54) FOUR-TO-SIX MODULATION ENCODER

(75) Inventor: Bin Ni, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/873,797

(22) Filed: Oct. 17, 2007

Related U.S. Application Data

(60) Provisional application No. 60/829,755, filed on Oct. 17, 2006.

(51) Int. Cl.
*H03M 5/00* (2006.01)
(52) U.S. Cl. .......................... 341/58; 341/50
(58) Field of Classification Search ............... 341/50–70
See application file for complete search history.

(56) References Cited

U.S. PATENT DOCUMENTS

| | | | |
|---|---|---|---|
| 6,300,886 B1 * | 10/2001 | Hayami | 341/59 |
| 6,496,541 B1 * | 12/2002 | Kahlman et al. | 341/59 |
| 6,577,255 B2 * | 6/2003 | Hayami et al. | 341/59 |
| 6,861,965 B2 * | 3/2005 | Kayanuma et al. | 341/59 |

\* cited by examiner

*Primary Examiner*—Lam T Mai

(57) ABSTRACT

An encoding system for a high density optical storage medium includes a conversion module that receives a data pattern and generates a code pattern based on the data pattern. A code connector module receives the code pattern, determines whether the code pattern includes a first predetermined code pattern, and outputs a substitution code pattern when the code pattern includes the first predetermined code pattern. The first predetermined code pattern includes first and second consecutive code words that include first and second bit sequences "01010*" and "??????," respectively, "?" corresponds to an in consequential bit, and "*" corresponds to an undetermined bit.

22 Claims, 7 Drawing Sheets

| Data Word | State 0 Code Word | Next State | State 1 Code Word | Next State |
|---|---|---|---|---|
| 0 | 10100* | 0 | 001000 | 0 |
| 1 | 101000 | 1 | 001000 | 1 |
| 2 | 101001 | 1 | 001001 | 1 |
| 3 | 10010* | 0 | 01010* | 0 |
| 4 | 100100 | 1 | 010100 | 1 |
| 5 | 100101 | 1 | 010101 | 1 |
| 6 | 101010 | 0 | 00010* | 0 |
| 7 | 101010 | 1 | 000100 | 1 |
| 8 | 100010 | 0 | 000101 | 1 |
| 9 | 100010 | 1 | 01000* | 0 |
| A | 10000* | 0 | 010000 | 1 |
| B | 10000# | 1 | 010001 | 1 |
| C | 000010 | 0 | 001010 | 0 |
| D | 000010 | 1 | 001010 | 1 |
| E | 00000* | 0 | 010010 | 0 |
| F | 00000* | 1 | 010010 | 1 |

FIG. 3

| | CW (n-1) | CW(n) | CW(n+1) | CW(n+2) | Substitution Code Words |
|---|---|---|---|---|---|
| Predetermined Code Pattern 1 | ????? | 101010 | 101010 | 101??? | ????? 001001 000010 101??? |
| Predetermined Code Pattern 2 | ???10 | 101010 | 101010 | 1????? | ???10 001001 000010 1????? |
| Predetermined Code Pattern 3 | ??1010 | 101010 | 101010 | ?????? | ??1010 001001 000010 ?????? |
| Predetermined Code Pattern 4 | ?????? | 010101 | 010101 | 0101?? | ?????? 001001 00000# 0101?? |
| Predetermined Code Pattern 5 | ?????1 | 010101 | 010101 | 01???? | ?????1 001001 00000# 01???? |
| Predetermined Code Pattern 6 | ?????# | 010101 | 010101 | 01???? | ?????# 001001 00000# 01???? |
| Predetermined Code Pattern 7 | ?????* | 010101 | 010101 | 01???? | ?????* 001001 00000* 01???? |
| Predetermined Code Pattern 8 | ???101 | 010101 | 010101 | ?????? | ???101 001001 00000* 00???? |
| Predetermined Code Pattern 9 | ???101 | 010101 | 01010* | 00???? | ???101 001001 00000* 00???? |

| | CW (n-1) | CW(n) | CW(n+1) | CW(n+2) | Substitution Code Words |
|---|---|---|---|---|---|
| Predetermined Code Pattern 1 | ????? | 101010 | 101010 | 101??? | ????? 001001 000010 101??? |
| Predetermined Code Pattern 2 | ???10 | 101010 | 101010 | 1????? | ???10 001001 000010 1????? |
| Predetermined Code Pattern 3 | ??1010 | 101010 | 101010 | ?????? | ??1010 001001 000010 ?????? |
| Predetermined Code Pattern 4 | ????? | 010101 | 010101 | 0101?? | ????? 001001 00000# 0101?? |
| Predetermined Code Pattern 5 | ????1 | 010101 | 010101 | 01???? | ????1 001001 00000# 01???? |
| Predetermined Code Pattern 6 | ?????# | 010101 | 010101 | 01???? | ?????# 001001 00000# 01???? |
| Predetermined Code Pattern 7 | ?????* | 010101 | 010101 | 01???? | ?????* 001001 00000# 01???? |
| Predetermined Code Pattern 8 | ???101 | 010101 | 010101 | ?????? | ???101 001001 00000* 00???? |
| Predetermined Code Pattern 9 | ???101 | 010101 | 01010* | ?????? | ???101 001001 00000* ?????? |

FOUR-TO-SIX MODULATION ENCODER

CROSS-REFERENCE TO RELATED APPLICATIONS

This application claims the benefit of U.S. Provisional Application No. 60/829,755, filed on Oct. 17, 2006. The disclosure of the above application is incorporated herein by reference in its entirety.

FIELD

The present disclosure relates to data coding in communication channels, and more particularly to data coding involving four-to-six modulation.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Many communication systems including magnetic and optical recording systems, communicate a particular type of data patterns. For example, run length limited (RLL) codes include limitations such as a minimum and a maximum run length (commonly referred to as a D constraint and a K constraint, respectively). D and K constraints may be written in slash notation as a D/K constraint.

RLL codes include at least D data "0s" between consecutive data "1s" and a maximum of K data "0s" between consecutive data "1s". For example, the Four-to-Six Modulation code has a D/K constraint of ⅓₁₀.

Data patterns having a D/K constraint of ⅓₁₀ can include pulses with a duration of two channel bit lengths, or 2T patterns, within the data patterns, where "T" corresponds to a single channel bit duration. Each "1" channel bit in the data pattern represents a polarity transition. Two polarity transitions separated by 2 channel bits (e.g. "101") correspond to one 2T pattern.

SUMMARY

An encoding system for a high density optical storage medium includes a conversion module that receives a data pattern and generates a code pattern based on the data pattern. A code connector module receives the code pattern, determines whether the code pattern includes a first predetermined code pattern, and outputs a substitution code pattern when the code pattern includes the first predetermined code pattern. The first predetermined code pattern includes first and second consecutive code words that include first and second bit sequences "01010*" and "??????," respectively, "?" corresponds to an inconsequential bit, and "*" corresponds to an undetermined bit.

In other features, a replacement table stores a plurality of predetermined code patterns including the predetermined code pattern. Each of the plurality of predetermined code patterns includes a current code word, a previous code word, a first subsequent code word, and a second subsequent code word. The first and second bit sequences of the first predetermined code pattern correspond to the first subsequent code word and the second subsequent code word, respectively. The predetermined code pattern further includes third and fourth bit sequences "????101" and "010101," respectively, and the third and fourth bit sequences correspond to the previous code word and the current code word, respectively, of the code pattern. The substitution code pattern includes a bit sequence "???101 001001 00000* ??????."

In other features, the code pattern includes a bit sequence "XXXXXX XXX101 010101 01010* 101010 101010 101010 XXXXXX." The substitution code pattern includes a bit sequence "XXXXXX XXX101 001001 00000* 101010 101010 101010 XXXXXX." A second predetermined code pattern includes a bit sequence "?????? 101010 101010 101???." The code connector module outputs a second substitution code pattern that includes a bit sequence "XXXXXX XXX101 001001 00000* 001001 000010 101010 XXXXXX." A four to six modulation (FSM) encoder includes the encoding system. A high-definition digital versatile disc (HD DVD) drive includes the FSM encoder.

An encoding system for a high density optical storage medium includes conversion means for receiving a data pattern and generating a code pattern based on the data pattern, and code connecting means for receiving the code pattern, determining whether the code pattern includes a first predetermined code pattern, and outputting a substitution code pattern when the code pattern includes the first predetermined code pattern. The first predetermined code pattern includes first and second consecutive code words that include first and second bit sequences "01010*" and "??????," respectively, "?" corresponds to an inconsequential bit, and "*" corresponds to an undetermined bit.

In other features, a replacement table stores a plurality of predetermined code patterns including the predetermined code pattern. Each of the plurality of predetermined code patterns includes a current code word, a previous code word, a first subsequent code word, and a second subsequent code word. The first and second bit sequences of the first predetermined code pattern correspond to the first subsequent code word and the second subsequent code word, respectively. The predetermined code pattern further includes third and fourth bit sequences "????101" and "010101," respectively, and the third and fourth bit sequences correspond to the previous code word and the current code word, respectively, of the code pattern. The substitution code pattern includes a bit sequence "???101 001001 00000* ??????."

In other features, the code pattern includes a bit sequence "XXXXXX XXX101 010101 01010* 101010 101010 101010 XXXXXX." The substitution code pattern includes a bit sequence "XXXXXX XXX101 001001 00000* 101010 101010 101010 XXXXXX." A second predetermined code pattern that includes a bit sequence "?????? 101010 101010 101???." The code connecting means outputs a second substitution code pattern that includes a bit sequence "XXXXXX XXX101 001001 00000* 001001 000010 101010 XXXXXX." Four to six modulation (FSM) encoding means includes the encoding system of. A high-definition digital versatile disc (HD DVD) drive includes the FSM encoding means of claim 22.

An encoding method for a high density optical storage medium includes receiving a data pattern, generating a code pattern based on the data pattern, determining whether the code pattern includes a first predetermined code pattern, and outputting a substitution code pattern when the code pattern includes the first predetermined code pattern. The first predetermined code pattern includes first and second consecutive code words that include first and second bit sequences "01010*" and "??????," respectively, "?" corresponds to an inconsequential bit, and "*" corresponds to an undetermined bit.

In other features, the encoding method further includes storing a plurality of predetermined code patterns including the predetermined code pattern in a replacement table. Each of the plurality of predetermined code patterns includes a current code word, a previous code word, a first subsequent code word, and a second subsequent code word. The first and second bit sequences of the first predetermined code pattern correspond to the first subsequent code word and the second subsequent code word, respectively. The predetermined code pattern further includes third and fourth bit sequences "????101" and "010101," respectively, and the third and fourth bit sequences correspond to the previous code word and the current code word, respectively, of the code pattern. The substitution code pattern includes a bit sequence "???101 001001 00000* ??????."

In other features, the code pattern includes a bit sequence "XXXXXX XXX101 010101 01010* 101010 101010 101010 XXXXXX." The substitution code pattern includes a bit sequence "XXXXXX XXX101 001001 00000* 101010 101010 101010 XXXXXX." A second predetermined code pattern that includes a bit sequence "?????? 101010 101010 101???." The encoding method further includes outputting a second substitution code pattern that includes a bit sequence "XXXXXX XXX101 001001 00000* 001001 000010 101010 XXXXXX."

A computer program stored for use by a processor for operating a high density optical storage medium includes receiving a data pattern, generating a code pattern based on the data pattern, determining whether the code pattern includes a first predetermined code pattern, and outputting a substitution code pattern when the code pattern includes the first predetermined code pattern. The first predetermined code pattern includes first and second consecutive code words that include first and second bit sequences "01010*" and "??????," respectively, "?" corresponds to an inconsequential bit, and corresponds to an undetermined bit.

In other features, the computer program further includes storing a plurality of predetermined code patterns including the predetermined code pattern in a replacement table. Each of the plurality of predetermined code patterns includes a current code word, a previous code word, a first subsequent code word, and a second subsequent code word. The first and second bit sequences of the first predetermined code pattern correspond to the first subsequent code word and the second subsequent code word, respectively. The predetermined code pattern further includes third and fourth bit sequences "????101" and "010101," respectively, and the third and fourth bit sequences correspond to the previous code word and the current code word, respectively, of the code pattern. The substitution code pattern includes a bit sequence "???101 001001 00000* ??????."

In other features, the code pattern includes a bit sequence "XXXXXX XXX101 010101 01010* 101010 101010 101010 XXXXXX." The substitution code pattern includes a bit sequence "XXXXXX XXX101 001001 00000* 101010 101010 101010 XXXXXX." A second predetermined code pattern that includes a bit sequence "?????? 101010 101010 101???." The computer program further includes outputting a second substitution code pattern that includes a bit sequence "XXXXXX XXX101 001001 00000* 001001 000010 101010 XXXXXX."

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 is a table illustrating data conversions according to the present disclosure;

FIG. 4 is a table illustrating code word substitutions according to the prior art;

FIG. 5 is a table illustrating code word substitutions according to the present disclosure;

DETAILED DESCRIPTION

Figure 1:
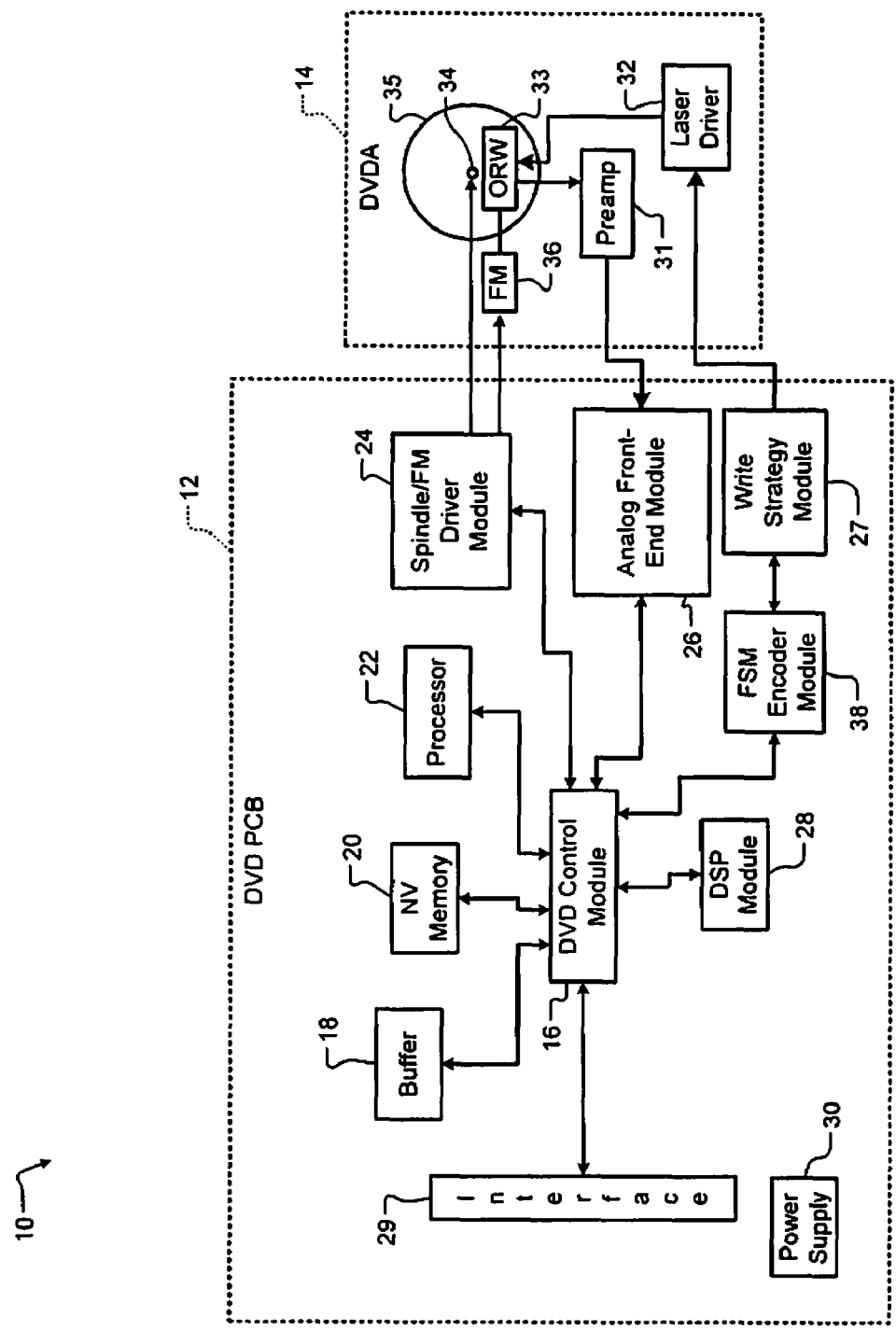
FIG. 1 is a functional block diagram of a DVD drive according to the present invention.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Typically, modulation techniques such as four-to-six modulation processes are used for high-density storage media including, but not limited to, high-definition digital versatile discs (HD-DVDs). Generally, the four-to-six modulation (FSM) process is designed to ensure that a maximum repeated minimum run-length (MRMTR) of modulated data generated by the FSM coding process equates to six. In other words, the FSM process ensures that at a maximum, six consecutive (2T) patterns are output in the modulated data (i.e., in the modulated bit patterns). During read operations from the storage media, 2T patterns typically result in small amplitudes of signals read ("readout" signal) from the high-density storage media. Therefore readout signals that include several (i.e., seven or more) consecutive 2T patterns can be difficult to recover from the high-density storage media and are more susceptible to degradation by noise.

The FSM process typically ensures that modulated bit patterns have a MRMTR of six. However, instances (i.e., "bugs") remain in which the modulated bit patterns possess seven consecutive 2T patterns. An encoding system according to the present disclosure enables the FSM process to limit the MRMTR to six consecutive 2T patterns, thereby ensuring the integrity of the read back signals from high-density storage media.

Referring now to FIG. 1, a high-definition digital versatile disc (HD DVD) drive 10 that implements an encoding system is shown to include a DVD printed circuit board (PCB) 12 and a DVD assembly (DVDA) 14. Although the HD DVD drive 10 is shown, the present disclosure also applies to compact disc (CD) drives and other optical media.

The DVD PCB 12 includes a DVD control module 16, a buffer 18, nonvolatile memory 20, a processor 22, a spindle/FM (feed motor) driver module 24, an analog front-end module 26, a write strategy module 27, and a DSP module 28.

The DVD control module 16 controls components of the DVDA 14 and communicates with an external device (not shown) via an I/O interface 29. The external device may include a computer, a multimedia device, a mobile computing device, etc. The I/O interface 29 may include wireline and/or wireless communication links.

The DVD control module 16 may receive data from the buffer 18, nonvolatile memory 20, the processor 22, the spindle/FM drive module 24, the analog front-end module 26, the write strategy module 27, the DSP module 28, and/or the I/O interface 29. The processor 22 may process the data, including encoding, decoding, filtering, and/or formatting. The DSP module 28 performs signal processing, such as video and/or audio coding/decoding. The processed data may be output to the buffer 18, nonvolatile memory 20, the processor 22, the spindle/FM drive module 24, the analog front-end module 26, the write strategy module 27, the DSP module 28, and/or the I/O interface 29.

The DVD control module 16 may use the buffer 18 and/or nonvolatile memory 20 to store data related to the control and operation of the HD DVD drive 10. The buffer 18 may include DRAM, SDRAM, etc. The nonvolatile memory 20 may include flash memory (including NAND and NOR flash memory), phase change memory, magnetic RAM, or multi-state memory, in which each memory cell has more than two states. The DVD PCB 12 includes a power supply 30 that provides power to the components of the HD DVD drive 10.

The DVDA 14 may include a preamplifier device 31, a laser driver 32, and an optical device 33, which may be an optical read/write (ORW) device or an optical read-only (OR) device. A spindle motor 34 rotates an optical storage medium 35, and a feed motor 36 actuates the optical device 33 relative to the optical storage medium 35. When reading data from the optical storage medium 35, the laser driver provides a read power to the optical device 33. The optical device 33 detects data from the optical storage medium 35, and transmits the data to the preamplifier device 31.

The analog front-end module 26 receives data from the preamplifier device 31 and performs such functions as filtering and N/D conversion. An encoding module, such as FSM encoder module 38, may implement the encoding system of the present disclosure. The FSM encoder module 38 encodes data received from an external device. In various embodiments, the FSM encoder module 38 may be implemented by the same integrated chip as the DVD control module 16 and/or by additional integrated chips. Alternatively, the FSM encoder module 38 may be implemented as a system-on-a-chip (SOC).

To write to the optical storage medium 35, the write strategy module 27 transmits power level and timing data to the laser driver 32. The laser driver 32 controls the optical device 33 to write data to the optical storage medium 35.

Figure 2:
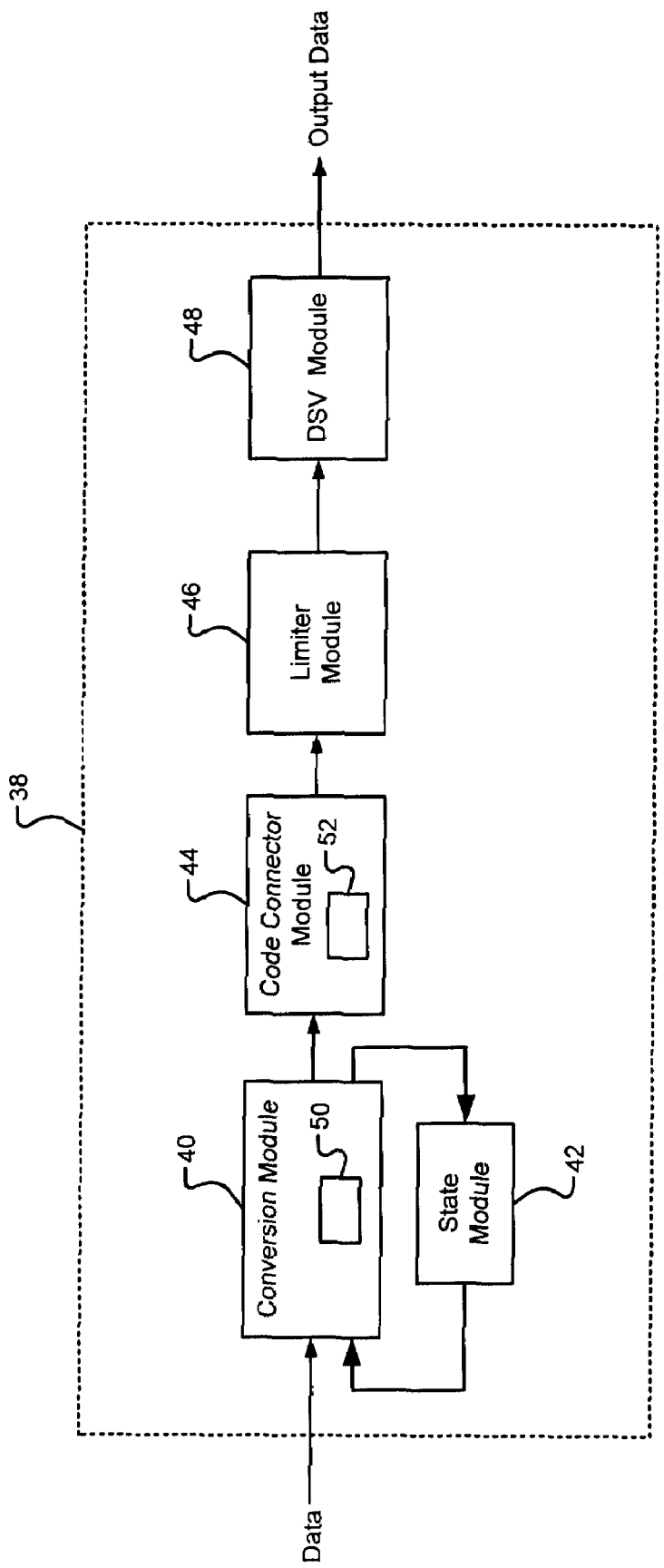
FIG. 2 is a four to six module (FSM) encoder according to the present disclosure.

Referring now to FIGS. 1 and 2, a FSM encoder module 38 is shown in more detail. The FSM encoder module 38 includes a conversion module 40, a state module 42, a code connector module 44, a limiter module 46, and a digital sum value (DSV) module 48. The FSM encoder module 38 receives data (e.g., digital information) from an external device (e.g., DVD control module 16) and modulates the data for recording to an optical device 33.

Upon receiving data (i.e., data words) transmitted from an external device, the conversion module 40 converts the data words into corresponding code words based in-part on a main code table 50 stored in the conversion module 40. The main code table 50 will be discussed in further detail below.

During operation of the encoding system, the conversion module 40 generates a current, or n, code word (CW(n)) that corresponds to a current data word (DW(n)) received from an external device based on the current state (S(n)) of the DW(n) and the main code table 50. The conversion module 40 reads the S(n) of the DW(n) from the state module 42. The state module 42 additionally generates and stores the next state (S(n+1)) for use by the conversion module 40. The conversion module 40 then transmits the code words to the code connector module 40 for further processing.

In the present implementation, the code words can include undetermined bits, each denoted by "*" (for example only) and/or DSV control bits, each denoted by "#" (for example only). As discussed in more detail below, the limiter module 46 and the DSV module 48 respectively generate bit values (i.e. "0" or "1") for each of the undetermined and DSV control bits.

Additionally, in the present implementation, the data words each include four data bits and the code words each include six channel bits, though data words and code words of variable size are contemplated. It is noteworthy that the code words generated by the conversion module 40 fall within the D/K constraint imposed by the FSM process. In the present implementation, the FSM encoder module 38 imposes a 1/10 constraint.

The code connector module 44 may implement the encoding system of the present disclosure. The code connector module 44 receives a set of code words (i.e., a code pattern) generated by the conversion module 40 and selectively generates a substitution code pattern based on the received code pattern and a replacement code table 52. A code pattern includes a preceding code word (CW(n−1)), a current code word CW(n), and subsequent code words (i.e. CW(n+1) and CW(n+2)).

In this manner, the code connector module 44 attempts to ensure that the maximum number of 2T patterns contained in a code pattern does not exceed six. The operation of the code connector module 44 will be discussed in more detail in FIG. 3.

The limiter module 46 receives substitution code patterns from the code connector module 44 and generates a pre-DSV code pattern. The limiter module 46 generates the pre-DSV code pattern by modifying each respective undetermined bit in a substitution code pattern based on a set of limiter principles, discussed with reference to FIG. 4. The limiter module 46 determines a bit value of each respective undetermined bit or sets the undetermined bit to a DSV control bit. In other words, the pre-DSV code pattern does not include any undetermined bits after processing by the limiter module 46.

The limiter module 46 then transmits the pre-DSV code pattern to the DSV module 48. The DSV module 48 generates a bit value (i.e., "0" or "1") for each respective DSV control bit based on the pre-DSV code pattern. The DSV module 48 operates to control DSV control bits during the FSM process in order to maintain a minimal DSV. The DSV module 48 then generates and outputs an output code pattern based on the pre-DSV pattern. The output code pattern is subsequently converted to non-return to zero inverted (NRZI) code and written to the storage medium 35.

Referring now to FIG. 3, the main code table 50 is shown in more detail. As previously discussed, the conversion module 40 generates a code word CW(n) that corresponds to a data word DW(n) received from an external device based on a state S(n) of the data word DW(n). As illustrated, the main code table 50 stores code words based on a data word (i.e., DW(n)) received from an external device. The code words are further identified by the state S(n) (e.g. "0" state or "1" state) of the DW(n).

For example, the conversion module 40 converts a data word DW(n) equaling "2" to a code word CW(n) of "101001" when the state S(n) equals "0" and to a code word CW(n) of "001001" when the state S(n) equals "1". Furthermore, the main code table 50 identifies a state S(n+1) associated with the next data word (DW(n+1)) based on the data word DW(n). Referring to the previous example, the data word DW(n) equaling "2" and including a state S(n) equaling "1", identifies a state S(n+1) equaling "1". In the present implementation, the initial state corresponding to an initial data word transmitted from an external device is predefined according to the FSM process.

Referring now to FIG. 4, a conventional replacement table 53 is shown in more detail. The replacement table 53 illustrates various substitution code patterns that may be used by the code connector module 44. The code connector module 44 stores predetermined code patterns 1-9 (referred to collectively as the predetermined code patterns) in the replacement table 53. Each predetermined code pattern includes replacement bit sequences associated with a code word CW(n−1), a code word CW(n), and subsequent code words (i.e. CW(n+1) and CW(n+2)). In other words, the code words CW(n−1) through CW(n+2) correspond to a sequence of 4 consecutive code words that comprise a particular one of the predetermined code patterns.

Typically, the code connector module 44 receives the code words (i.e. the code patterns) generated by the conversion module 40 and determines whether a particular code pattern matches one of the predetermined code patterns in the replacement table 53. In other words, the code connector module 44 determines whether a bit sequence of comprising the code words CW(n−1), CW(n), CW(n+1), and CW(n+2) matches a bit sequence of one of the predetermined code patterns.

For example, the predetermined code pattern 5 includes a replacement bit sequence of "?????1," "010101," "010101," and "01????" that may correspond to the code words CW(n−1), CW(n), CW(n+1), and CW(n+2), respectively, of a code pattern output from the code connector module 44. Each "?" denotes an inconsequential bit (i.e. a "don't care" bit). When the code connector module 44 determines that a code pattern matches a bit sequence associated with a predetermined code pattern, the code connector module 44 performs a replacement, or substitution, of at least one of the code words of the code pattern to generate a substitution code pattern. In the present example, when a code pattern matches the predetermined code pattern 5, the code connector module 44 modifies the code pattern with a substitution code pattern (i.e. a replacement bit sequence) "?????1 001001 00000# 01????".

In the present implementation, the inconsequential bits of a predetermined code pattern can include a bit value of either "1" or "0". In other words, a code pattern may match a predetermined code pattern regardless of whether bits of the code pattern corresponding to inconsequential bits of the replacement bit sequence equal a bit value of "1" or "0". Replacement bit sequences corresponding to the code words CW(n−1) and CW(n+2) include the inconsequential bits, although various other replacement bit sequences are contemplated.

Referring to FIGS. 2-4, an exemplary FSM process is described. The conversion module 40 receives a data pattern (i.e. a sequence of data bytes) comprising "X5 53 66 6X". Here, each data byte includes two data words represented in hexadecimal format. The conversion module 40 outputs a corresponding code pattern of "XXXXXX XXX101 010101 01010* 101010 101010 101010 XXXXXX" based on the main code table 50 and the received data pattern. The "X" bits of the exemplary data and code word patterns are equivalent to the inconsequential bits ("?") discussed above.

It is noted that the state S(n) of the hexadecimal digit (i.e. data word) "X" of the data byte "X5" is unknown and therefore the state S(n+1) also remains unknown. Consequently, the conversion module 40 converts the hexadecimal digit "5" of the data byte "X5" to "XXX101". The last three code bits of the code word corresponding to the "5" are "101" regardless of the previous state of the hexadecimal digit "X". The conversion module 40 converts each of the first three code bits of the code word equal to "X".

The code connector module 44 receives the code pattern of "XXXXXX XXX101 010101 01010* 101010 101010 101010 XXXXXX" transmitted from the conversion module 40. The code words "101010*", "101010", "101010", and "101010" of the code pattern match the replacement bits of the predetermined code pattern 1 that correspond to the code words CW(n−1), CW(n), CW(n+1), and CW(n+2), respectively. Consequently, the code connector module 44 replaces the code words "01010*", "101010", "101010", and "101010" with the substitution code words "??????", "001001", "000010", and "101???", respectively, thereby generating a substitution code pattern "XXXXXX XXX101 010101 01 010* 001001 000010 101010 XXXXXX".

The limiter module 46 receives the substitution code pattern from the code connector module 44. As previously noted, the limiter module 46 generates a pre-DSV code pattern based on the substitution code pattern and a set of limiter operations. The limiter module 46 applies the set of limiter operations to each respective undetermined bit. The limiter module 46 sets the undetermined bit to a value of "0" when a bit following the undetermined bit equals "1". The limiter module 46 sets the undetermined bit to a value of "1" when the undetermined bit is preceded or followed by nine consecutive "0"s, thereby ensuring the substitution code pattern adheres to the DIK constraint of the FSM process. In the present implementation, DSV control bits and undetermined bits are effectively considered to possess a bit value of "0" when the limiter module 46 determines the presence of nine consecutive "0"s preceding or following the undetermined bit.

If the limiter module 46 fails to detect either a following bit equaling "1" or the presence of nine consecutive bits preceding or following the undetermined bit, the limiter module 46 sets the undetermined bit to a DSV control bit. In other words, the DSV module 48 determines the bit value of the undetermined bit in order to maintain a minimal DSV.

In the present example, the limiter module 46 sets the undetermined bit in the substitution code word "01010*" to # based on the set of limiter operations and outputs a pre-DSV pattern of "XXXXXX XXX101 010101 01010# 001001 000010 101010 XXXXXX" to the DSV module 48. In the present example, the DSV module 48 may set the DSV control bit to a bit value of "1". Consequently, seven consecutive 2T patterns could potentially be generated in the NRZI code and written to the storage medium 35.

Referring now to FIG. 5, the replacement table 52 of the FSM decoder module 38 is shown in more detail. The replacement table 52 enables the encoding system of the present disclosure to limit the MRMTR to six consecutive 2T patterns, thereby ensuring the integrity of the read back signals from high-density storage media.

Referring to FIGS. 2, 3, and 5, a second exemplary FSM processing operation that uses the replacement table 52 is discussed in more detail. For the purpose of simplicity, the data pattern "X5 53 66 6X" previously discussed will be used. The conversion module 40 receives the data pattern "X5 53 66 6X" and outputs the code pattern "XXXXXX XXX101 010101 01010* 101010 101010 101010 XXXXXX" based on the main code table 50 and the received data pattern.

The code connector module 44 receives the code pattern "XXXXXX XXX101 010101 01010* 101010 101010 101010 XXXXXX" transmitted from the conversion module 40. In the present example, the code words "XXX101", "010101", "01010*", and "101010" of the code pattern respectively match a replacement bit sequence of the predetermined code pattern 9 that correspond to the code words CW(n−1), CW(n), CW(n+1), and CW(n+2). In other words, the code word CW(n+2) of the predetermined code pattern 9 as shown in the replacement table of FIG. 5 is "??????." In contrast, the code word CW(n+2) of the predetermined code pattern 9 as shown in the replacement table of FIG. 4 is "00????." As a result, the code connector module 44 replaces the code words "XXX101", "010101", "01010*", and "101010", with the substitution code words "???101", "001001", "00000*", and "??????", respectively, thereby generating a substitution code pattern "XXXXXX XXX101 001001 00000* 101010 101010 101010 XXXXXX".

In the present example, the code connector 44 further determines that the substitution code pattern "XXXXXX XXX101 001001 00000* 101010 101010 101010 XXXXXX" includes code words "00000*", "101010", "101010", and "101010" that match the predetermined code pattern 1 corresponding to the code words CW(n−1), CW(n), CW(n+1), and CW(n+2), respectively. Therefore, the code connector module 44 performs a second replacement. For example, the code connector module 44 replaces the code words "00000*", "101010", "101010", and "101010" with the substitution code words "??????", "001001", "000010", and "101???", respectively, thereby generating a substitution code pattern "XXXXXX XXX101 001001 00000* 001001 000010 101010 XXXXXX".

In other words, in a given code pattern, replacing the predetermined code pattern 9 according to the replacement table 52 may result in a new code pattern including the corresponding substitution code pattern that matches the code words of the predetermined code pattern 1. As such, the code connector 44 performs a second replacement.

The limiter module 46 receives the substitution code pattern from the code connector module 44. In present example, the limiter module 46 sets the undetermined bit in the substitution code word "00000*" to "#" based on the set of limiter operations and outputs a pre-DSV pattern "XXXXXX XXX101 001001 00000# 001001 000010 101010 XXXXXX" to the DSV module 48.

The DSV module 48 may set the DSV control bit to a bit value of "1". However, the pre-DSV pattern generated by the encoding system does not include more than six consecutive 2T patterns, thereby ensuring accurate data and timing recovery. Additionally, the encoding system controls asymmetry issues by limiting the number of 2T patterns.

Figure 6:
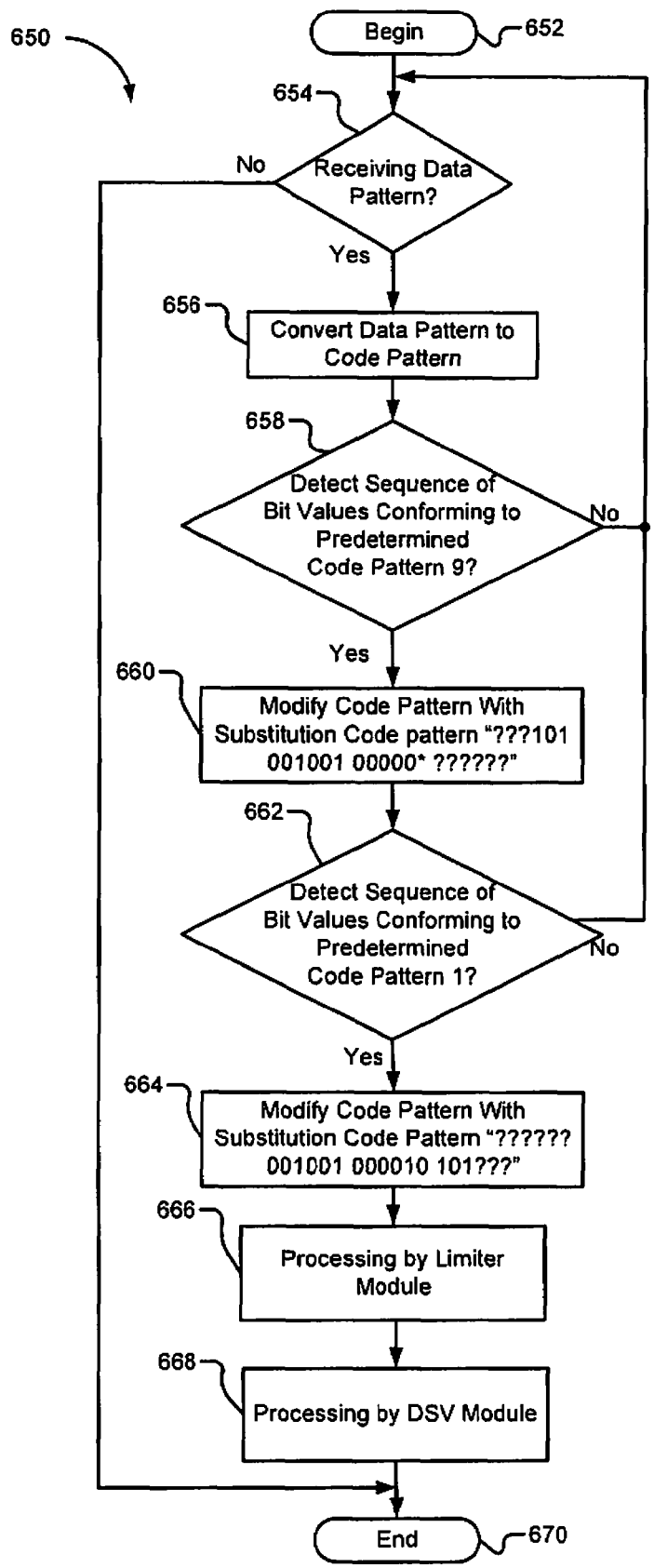
FIG. 6 is a flow diagram illustrating steps of a method for encoding a set of data bytes according to the present disclosure.

Referring now to FIG. 6, a method 650 for encoding a set of data bytes with the FSM encoder module 38 is shown in more detail. The method 650 begins in step 652. In step 654, the FSM encoder module 38 determines whether the FSM encoder module 38 is receiving a data pattern. If true, the method 650 proceeds to step 656. If false, the method 650 proceeds to step 670.

In step 656, the transformation module 40 converts the data pattern to a corresponding code pattern. In step 658, the code connector module 44 module determines whether a consecutive bit sequence of the code pattern conforms to the replacement bit sequence associated with the predetermined code pattern 9 stored in the replacement table 52. If true, the method 650 proceeds to step 660. If false, the method 650 returns to step 654.

In step 660, the code connector module 44 modifies the code pattern by respectively replacing the bit sequence of the code pattern that matches the replacement bit sequence with the substitution code words "???101", "0001001", "00000*", and "??????". In step 662, the code connector module 44 module determines whether a second consecutive bit sequence of the code pattern matches the replacement bit sequence associated with the predetermined code pattern 1 stored in the replacement table 52. If true, the method 650 proceeds to step 664. If false, the method 650 returns to step 654.

In step 664, the code connector module 44 modifies the code pattern by respectively replacing the second bit sequence of the code pattern that matches the replacement bit sequence associated with the predetermined code pattern 1 with the substitution code words "??????", "001001", "000010". and "101???". In step 666, the limiter module 46 processes the output of the code connector module 44 (i.e. a substitution code pattern). In step 668, the DSV module 48 processes the output of the limiter module 46 (i.e. a pre-DSV pattern). In step 670, the method 650 ends.

Figure 7:
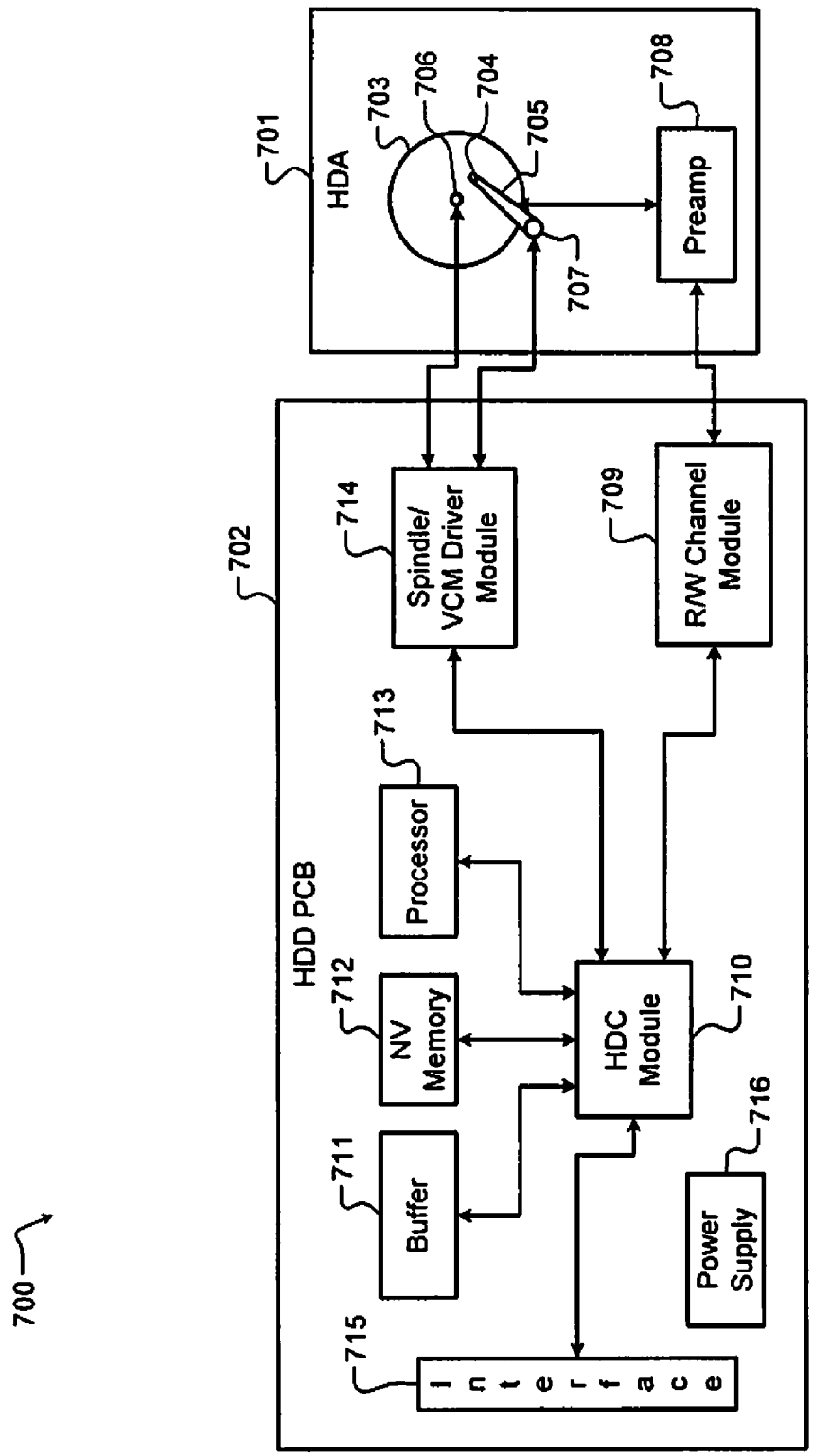
FIG. 7 is a functional block diagram of a hard disk drive.

Referring now to FIG. 7, the teachings of the disclosure can be implemented in a read/write channel module (hereinafter, "read channel") 709 of a hard disk drive (HDD) 700. The HDD 700 includes a hard disk assembly (HDA) 701 and an HDD printed circuit board (PCB) 702. The HDA 701 may include a magnetic medium 703, such as one or more platters that store data, and a read/write device 704. The read/write device 704 may be arranged on an actuator arm 705 and may read and write data on the magnetic medium 703. Additionally, the HDA 701 includes a spindle motor 706 that rotates the magnetic medium 703 and a voice-coil motor (VCM) 707 that actuates the actuator arm 705. A preamplifier device 708 amplifies signals generated by the read/write device 704 during read operations and provides signals to the read/write device 704 during write operations.

The HDD PCB 702 includes the read channel 709, a hard disk controller (HDC) module 710, a buffer 711, nonvolatile memory 712, a processor 713, and a spindle/VCM driver module 714. The read channel 709 processes data received from and transmitted to the preamplifier device 708. The HDC module 710 controls components of the HDA 701 and communicates with an external device (not shown) via an I/O interface 715. The external device may include a computer, a multimedia device, a mobile computing device, etc. The I/O interface 715 may include wireline and/or wireless communication links.

The HDC module 710 may receive data from the HDA 701, the read channel 709, the buffer 711, nonvolatile memory 712, the processor 713, the spindle/VCM driver module 714, and/or the I/O interface 715. The processor 713 may process the data, including encoding, decoding, filtering, and/or formatting. The processed data may be output to the HDA 701, the read channel 709, the buffer 711, nonvolatile memory 712, the processor 713, the spindle/VCM driver module 714, and/or the I/O interface 715.

The HDC module 710 may use the buffer 711 and/or nonvolatile memory 712 to store data related to the control and operation of the HDD 700. The buffer 711 may include DRAM, SDRAM, etc. The nonvolatile memory 712 may include flash memory (including NAND and NOR flash memory), phase change memory, magnetic RAM, or multi-state memory, in which each memory cell has more than two states. The spindle/VCM driver module 714 controls the spindle motor 706 and the VCM 707. The HDD PCB 702 includes a power supply 716 that provides power to the components of the HDD 700.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. An encoding system for a high density optical storage medium, comprising:
a conversion module that receives a data pattern and generates a code pattern based on the data pattern; and
a code connector module that receives said code pattern, determines whether said code pattern includes a first predetermined code pattern, and outputs a substitution code pattern when said code pattern includes said first predetermined code pattern;
wherein said first predetermined code pattern includes first and second consecutive code words that include first and second bit sequences "01010*" and "??????," respectively, "?" corresponds to an inconsequential bit, and "*" corresponds to an undetermined bit.

2. The encoding system of claim 1 further comprising a replacement table that stores a plurality of predetermined code patterns including said predetermined code pattern.

3. The encoding system of claim 2 wherein each of said plurality of predetermined code patterns includes a current code word, a previous code word, a first subsequent code word, and a second subsequent code word.

4. The encoding system of claim 3 wherein said first and second bit sequences of said first predetermined code pattern correspond to said first subsequent code word and said second subsequent code word, respectively.

5. The encoding system of claim 4 wherein said predetermined code pattern further includes third and fourth bit sequences "????101" and "010101," respectively, and said third and fourth bit sequences correspond to said previous code word and said current code word, respectively, of said code pattern.

6. The encoding system of claim 5 wherein said substitution code pattern includes a bit sequence "???101 001001 00000* ??????."

7. The encoding system of claim 1 wherein said code pattern includes a bit sequence "XXXXXX XXX101 010101 01010* 101010 101010 101010 XXXXXX."

8. The encoding system of claim 7 wherein said substitution code pattern includes a bit sequence "XXXXXX XXX101 001001 00000* 101010 101010 101010 XXXXXX."

9. The encoding system of claim 8 further comprising a second predetermined code pattern that includes a bit sequence "?????? 101010 101010 101???."

10. The encoding system of claim 9 wherein said code connector module outputs a second substitution code pattern that includes a bit sequence "XXXXXX XXX101 001001 00000* 001001 000010 101010 XXXXXX."

11. A four to six modulation (FSM) encoder that includes the encoding system of claim 1.

12. A high-definition digital versatile disc (HD DVD) drive that includes the FSM encoder of claim 11.

13. An encoding method for a high density optical storage medium, comprising:
receiving a data pattern;
generating a code pattern based on the data pattern;
determining whether said code pattern includes a first predetermined code pattern; and
outputting a substitution code pattern when said code pattern includes said first predetermined code pattern;
wherein said first predetermined code pattern includes first and second consecutive code words that include first and second bit sequences "01010*" and "??????," respectively, "?" corresponds to an inconsequential bit, and "*" corresponds to an undetermined bit.

14. The encoding method of claim 13 further comprising storing a plurality of predetermined code patterns including said predetermined code pattern in a replacement table.

15. The encoding method of claim 14 wherein each of said plurality of predetermined code patterns includes a current code word, a previous code word, a first subsequent code word, and a second subsequent code word.

16. The encoding method of claim 15 wherein said first and second bit sequences of said first predetermined code pattern correspond to said first subsequent code word and said second subsequent code word, respectively.

17. The encoding method of claim 16 wherein said predetermined code pattern further includes third and fourth bit sequences "????101" and "010101," respectively, and said third and fourth bit sequences correspond to said previous code word and said current code word, respectively, of said code pattern.

18. The encoding method of claim 17 wherein said substitution code pattern includes a bit sequence "???101 001001 00000* ??????."

19. The encoding method of claim 13 wherein said code pattern includes a bit sequence "XXXXXX XXX101 010101 01010* 101010 101010 101010 XXXXXX."

20. The encoding method of claim 19 wherein said substitution code pattern includes a bit sequence "XXXXXX XXX101 001001 00000* 101010 101010 101010 XXXXXX."

21. The encoding method of claim 20 further comprising a second predetermined code pattern that includes a bit sequence "?????? 101010 101010 101???."

22. The encoding method of claim 21 further comprising outputting a second substitution code pattern that includes a bit sequence "XXXXXX XXX101 001001 00000* 001001 000010 101010 XXXXXX."

* * * * *

UNITED STATES PATENT AND TRADEMARK OFFICE
CERTIFICATE OF CORRECTION

PATENT NO. : 7,557,739 B1
APPLICATION NO. : 11/873797
DATED : July 7, 2009
INVENTOR(S) : Bin Ni Page 1 of 1

It is certified that error appears in the above-identified patent and that said Letters Patent is hereby corrected as shown below:

| | |
|---|---|
| Column 2, Line 54 | Delete "of" after "system" |
| Column 2, Line 56 | Delete "22" and insert -- 23 -- |
| Column 3, Line 36 | Insert -- * -- after "and" |
| Column 5, Line 53 | Delete "N/D" and insert -- A/D -- |
| Column 8, Line 48 | Delete "DIK" and insert -- D/K -- |

Signed and Sealed this

Twenty-second Day of September, 2009

David J. Kappos
*Director of the United States Patent and Trademark Office*